United States Patent [19]

Longwell et al.

[11] Patent Number: 4,982,120
[45] Date of Patent: Jan. 1, 1991

[54] POWER SUPPLY DECOUPLING MECHANISM FOR INTEGRATED CIRCUITS

[75] Inventors: Michael L. Longwell; Paul F. Groepler, both of Austin, Tex.

[73] Assignee: Dell Corporate Services Corporation, Austin, Tex.

[21] Appl. No.: 375,426

[22] Filed: Jul. 3, 1989

[51] Int. Cl.$^5$ .................. H03K 4/58; H03K 3/013; H03K 19/003; H03K 17/16
[52] U.S. Cl. .................. 307/572; 307/443; 307/542; 307/548; 307/482.1; 307/482; 307/578
[58] Field of Search ............. 307/482, 578, 443, 572, 307/542, 544, 548, 451, 246, 270, 296.8, 482.1; 357/23.6

[56] References Cited

U.S. PATENT DOCUMENTS

| | | | |
|---|---|---|---|
| 4,275,437 | 6/1981 | Boll et al. | 307/578 X |
| 4,484,092 | 11/1984 | Campbell, Jr. | 307/578 |
| 4,504,747 | 3/1985 | Smith et al. | 307/246 X |
| 4,626,715 | 12/1986 | Ishii | 307/542 X |
| 4,754,170 | 6/1988 | Toda et al. | 307/443 |
| 4,764,692 | 8/1988 | Bellinvia et al. | 307/578 X |
| 4,783,601 | 11/1988 | Hartgring et al. | 307/246 |
| 4,801,826 | 1/1989 | Cornelissen | 307/578 X |
| 4,864,164 | 9/1989 | Ohshima et al. | 307/443 |
| 4,890,021 | 12/1989 | Walker | 307/542 X |

Primary Examiner—Stanley D. Miller
Assistant Examiner—David R. Bertelson
Attorney, Agent, or Firm—Thomas G. Devine

[57] ABSTRACT

An integrated circuit is formed in a semiconductor chip and connected to at least a first source of voltage and at least a second source of voltage, negative with respect to the first source of voltage. A number of integrated circuit components are activated by the first and second sources of voltage and are interconnected to provide desired functions. An integrated circuit capacitive element in the form of the gate capacitance of a field effect transistor and in the form of a reversed biased diode is connected between the first and second sources of voltage to decouple integrated circuit inherent inductance in series with the first and second sources of voltage.

10 Claims, 3 Drawing Sheets

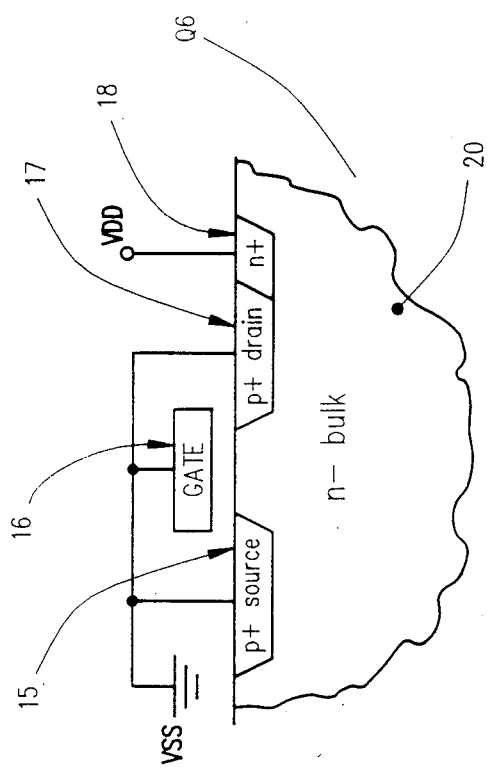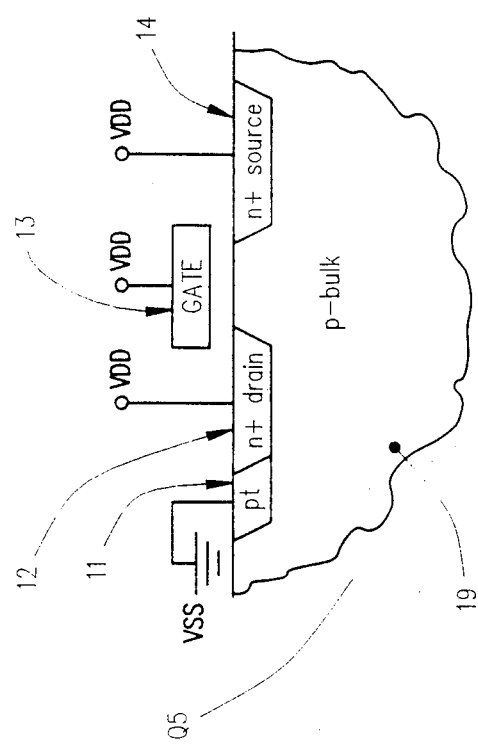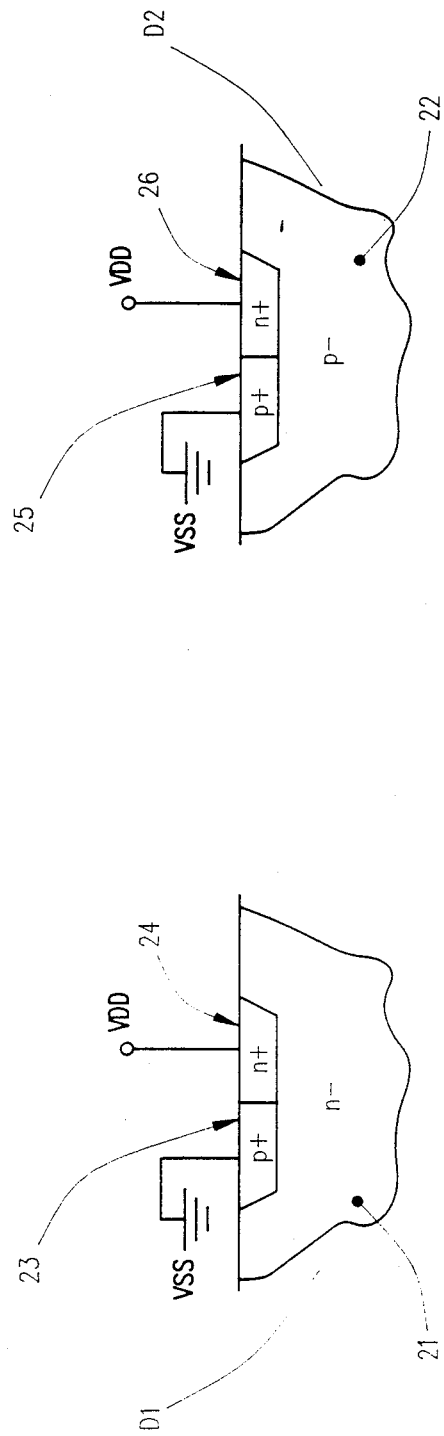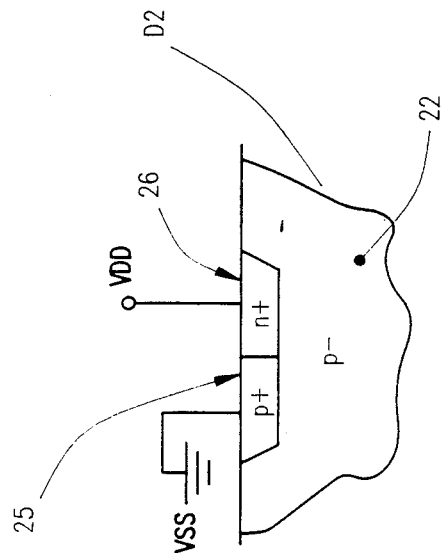

POWER SUPPLY DECOUPLING MECHANISM FOR INTEGRATED CIRCUITS

BACKGROUND OF THE INVENTION

1. Field of the Invention

This invention relates to decoupling inductance inherent in integrated circuits in series with the sources of voltage. In particular, this invention deals with internally formed capacitive compensation in the form of field effect transistor (FET) gate capacitance and reverse-biased diode capacitance.

2. Description of the Prior Art

In the prior art, inductive effects have been reduced by increasing the number of parallel voltage supply pins to the integrated circuit die.

Integrated circuit packages have been provided with extra cavities to accommodate discrete capacitors close to the die.

In both of these prior art solutions, manufacturing steps are added and additional cost is incurred.

BRIEF SUMMARY OF THE INVENTION

An integrated circuit, formed in a semiconductor chip implemented in complimentary metal-oxide-silicon (CMOS) in this preferred embodiment is connected to a first source of voltage and to a second source of voltage which is negative with respect to the first source. A plurality of integrated circuit components such as metal-oxide-silicon (MOS) transistors is appropriately connected to the first and second sources of voltage and interconnected to provide desired functions.

This integrated circuit as commonly used, mounted on a lead frame with pins and bond wires and encapsulated, and the assembly mounted on a printed circuit board, results in integrated circuit inherent inductance that is in series with the sources of voltage. This inherent inductance includes printed circuit board inductance, integrated component inductance, and inductance from the pins, lead frame, and bond wires. This integrated circuit inherent inductance in series with the sources of voltage is decoupled by internal capacitance formed as an integrated circuit between the first and second sources of voltage. This internally formed capacitance decouples not only inductance external to the semiconductor chip but also those inductances internal to the chip.

The internal capacitance is formed from MOS transistor capacitance. Also, the capacitances of reverse-biased diodes are used.

The principle object of this invention is to provide integrated circuit capacitance that decouples external and internal inductance in series with the sources of voltage supplying the integrated circuit.

This and other objects will be made evident in the detailed description that follows.

BRIEF DESCRIPTION OF THE DRAWINGS

FIGS. 3a and 3b are cross-sections of transistors connected to use gate capacitance.

FIGS. 4a and 4b are cross-sections of diodes reverse-biased for capacitance.

DETAILED DESCRIPTION OF THE INVENTION

In normal use, an integrated circuit is mounted on a lead frame, pins are attached, and the die is encapsulated. It is typically mounted on a printed circuit board. Inductances in series with the voltage sources energizing the integrated circuit cause unacceptable disturbances. These inductances include printed circuit board inductance which may be decoupled by adding a capacitor between the positive and negative terminals of the power supply, external to the integrated circuit. Other inductances such as that from the lead frame, the pins, the bond wires, and the component inductances in series with the voltage sources are not decoupled by the use of an external capacitance. This invention solves the problem of these additional inductances by providing capacitive elements built into the integrated circuit itself, connecting the positive and negative voltage sources.

Figure 1:
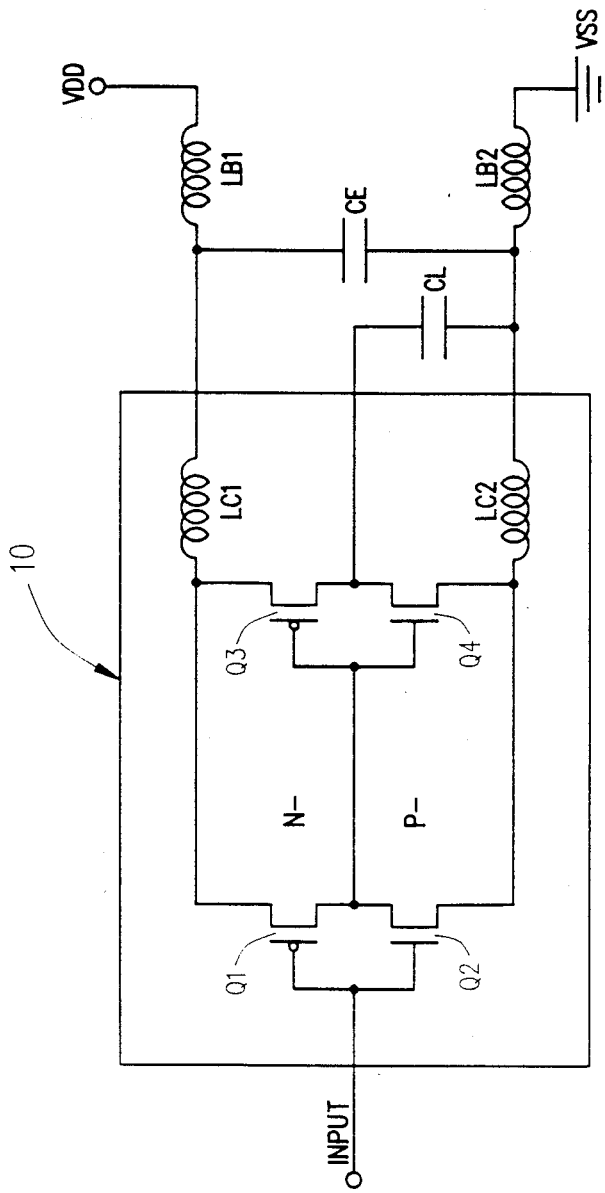
FIG. 1 illustrates partial decoupling of inherent inductance, in the prior art.

FIG. 1 illustrates the prior art solution to the problem of inductance in series with the voltage sources. Positive voltage $V_{DD}$ is shown applied through board inductance $L_{B1}$ through component inductance $L_{C1}$ and applied to CMOS transistors $Q_1$ and $Q_3$. Negative voltage $V_{SS}$ is shown applied through board inductance $L_{B2}$ through component inductance $L_{C2}$ to CMOS transistors $Q_2$ and $Q_4$. Load capacitance $C_L$ is shown connected between transistors $Q_3$ and $Q_4$ to voltage $V_{SS}$, through board inductance $L_{B2}$. The external capacitance $C_E$ is connected as shown, between voltages $V_{DD}$ and $V_{SS}$ to decouple board inductances $L_{B1}$ and $L_{B2}$. An input signal to the integrated circuit through transistors $Q_1$ and $Q_2$ demands instantaneous current because of the load capacitance $C_L$. The series inductance unacceptably slows the current.

Figure 2:
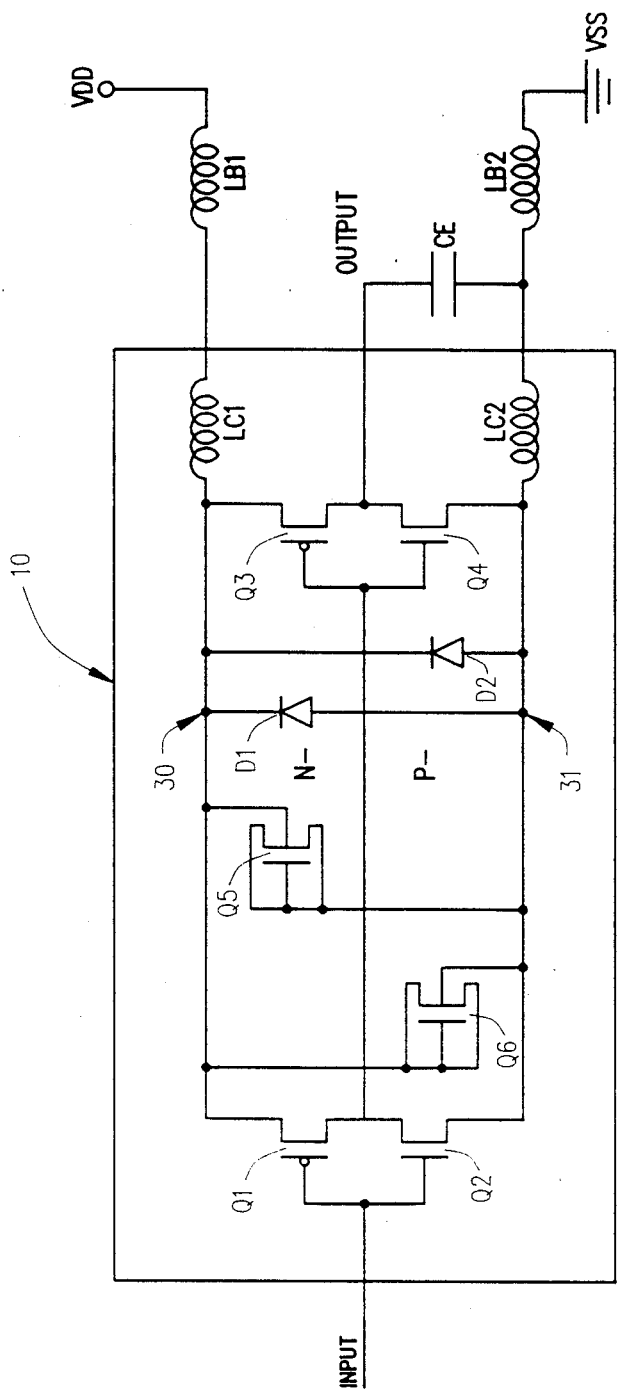
FIG. 2 illustrates decoupling of inherent integrated circuit inductance employing internal capacitance.

FIG. 2 is the same as FIG. 1, but illustrates the inventive, internally integrated capacitive decoupling of this invention. Transistor $Q_5$ is shown with its gate, source and drain all connected to node 31; its bulk is connected to node 30. This connection used the gate capacitance of transistor $Q_5$.

In similar fashion, transistor $Q_6$ has its gate, source, and drain connected to node 30 and its bulk connected to node 31, again taking advantage of the gate capacitance.

Diodes $D_1$ and $D_2$ are shown connected between nodes 30 and 31, reverse-biased to provide capacitance. In this manner, the internally generated inductance is decoupled. In FIG. 2, the external decoupling capacitance is shown removed. The external decoupling capacitance could, of course, also be used.

The preferred embodiment is shown as a CMOS implementation, which is commonly used in gate arrays. Many of the MOS transistors provided in gate arrays are not used for active circuitry and are, therefore, available to be used for this capacitive application as, for example, transistors $Q_5$ and $Q_6$. Likewise, in CMOS gate arrays, unused N+ or P+ diffusion regions can be connected as diodes $D_1$ and $D_2$.

In custom circuits, capacitive elements such as transistors $Q_5$ and $Q_6$, and diodes $D_1$ and $D_2$ can be formed at the outset. They are formed in a semiconductor chip, along with the active components.

FIGS. 3a and 3b illustrate the connection to be made for field effect transistors (FETs) which may be MOS transistors. In FIG. 3a, an N- channel device, gate 13, source 14, and drain 12 are all shown connected to voltage $V_{DD}$. The bulk 19 is shown connected through terminal 11 to voltage $V_{SS}$. This connection takes advantage of the capacitance of gate 13, drain 12, and source 14 with respect to the remainder of this structure.

FIG. 3b shows another FET, in this case, a P- channel device, gate 16, source 15, and drain 17 are all connected to voltage $V_{SS}$ and bulk 20 is connected through terminal 18 to voltage $V_{DD}$. This connection again takes advantage of gate 16, drain 17, and source 15 capacitance.

FIG. 4a illustrates diode $D_1$ connected as shown with bulk 21 connected through terminal 24 to voltage $V_{DD}$ with terminal 23 connected to voltage $V_{SS}$. This connection forms a reverse-biased diode which provides internal capacitance.

FIG. 4b illustrates diode $D_2$ with bulk 22 connected through terminal 25 to voltage $V_{SS}$, and terminal 26 connected to voltage $V_{DD}$. This provides a reverse-biased diode which, in turn, provides a capacitance to be used as shown in FIG. 2.

While this invention has been shown implemented in CMOS, those skilled in the art are aware that the invention is useful in other integrated circuit applications and is limited only by the appended claims.

The invention claimed is:

1. An integrated circuit, formed in a semiconductor chip, connected to at least a first source of voltage and at least a second source of voltage, negative with respect to the first source of voltage, comprising:
   (a) a plurality of integrated circuit components activated by the first and second sources of voltage and interconnected to provide a desired function; and
   (b) at least one integrated circuit capacitive element component connected between the first and second sources of voltage to decouple integrated circuit inherent inductance in series with the first and second sources of voltage.

2. The integrated circuit of claim 1 wherein the integrated circuit components are formed in a P- type semiconductor material.

3. An integrated circuit, formed in a semiconductor chip, connected to at least a first source of voltage and at least a second source of voltage, negative with respect to the first source of voltage, comprising;
   (a) a plurality of integrated circuit components activated by the first and second sources of voltage and interconnected to provide a desired function; and
   (b) at least one integrated circuit capacitive element component formed in a P-type semiconductor material, connected between the first and second sources of voltage to decouple integrated circuit inherent inductance in series with the first and second sources of voltage, wherein the capacitive element component comprises at least one N- channel field effect transistor having its gate, drain and source connected to the first source of voltage, and the P-type semiconductor material connected to the second source of voltage, thereby forming transistor capacitance.

4. The integrated circuit of claim 2 wherein the capacitive element component comprises at least one diode having a N+ type semiconductor material terminal connected to the first source of voltage, and a P+ type semiconductor material terminal connected to the second source of voltage thereby forming reverse-biased diode capacitance.

5. The integrated circuit of claim 1 wherein the integrated components are formed in N-type semiconductor material.

6. An integrated circuit, formed in a semiconductor chip, connected to at least a first source of voltage and at least a second source of voltage, negative with respect to the first source of voltage, comprising;
   (a) a plurality of integrated circuit components activated by the first and second sources of voltage and interconnected to provide a desired function; and
   (b) at least one integrated circuit capacitive element component formed in N-type semiconductor material, connected between the first and second sources of voltage to decouple integrated circuit inherent inductance in series with the first and second sources of voltage, wherein the capacitive element component comprises at least one P-channel field effect transistor having its gate, drain and source connected to the second source of voltage, and the N-type semiconductor material connected to the first source of voltage thereby forming transistor capacitance.

7. The integrated circuit of claim 5 wherein the capacitive element comprises at least one diode having an N+ type semiconductor material terminal connected to the first source of voltage, and a P+ type semiconductor material terminal connected to the second source of voltage thereby forming reverse-biased diode capacitance.

8. A complementary metal-oxide-silicon (CMOS) integrated circuit, connected to at least a first source of voltage and at least a second source of voltage negative with respect to the first source of voltage, comprising:
   (a) a semiconductor chip comprised partially of P-type semiconductor material and partially of N-type semiconductor material;
   (b) a plurality of integrated circuit components formed in the P-type semiconductor material and a plurality of integrated circuit components formed in the N-type semiconductor material, activated by the first and second sources of voltage and interconnected to provide desired functions;
   (c) at least one N-channel MOS transistor formed in the P-type semiconductor material having its gate, drain and source connected to the first source of voltage, and the P-type semiconductor material connected to the second source of voltage, thereby forming transistor capacitance to decouple integrated circuit inherent inductance in series with the first and second sources of voltage; and
   (d) at least one P-channel MOS transistor formed in the N-type semiconductor material having its gate, drain and source connected to the second source of voltage, and the N-31 type semiconductor material connected to the first source of voltage, thereby forming transistor capacitance to decouple integrated circuit inherent inductance in series with the first and second sources of voltage.

9. A complementary metal-oxide-silicon (CMOS) integrated circuit, connected to at least a first source of voltage and at least a second source of voltage negative with respect to the first source of voltage, comprising:
   (a) a semiconductor chip comprised partially of P-type semiconductor material and partially of N-type semiconductor material;
   (b) a plurality of integrated circuit components formed in the P-type semiconductor material and a plurality of integrated circuit components formed in the N-type semiconductor material, activated by the first and second sources of voltage and interconnected to provide desired functions;

(c) at least one diode formed in the P-type semiconductor material, having an N+ type semiconductor material terminal connected to the first source of voltage and a P+ type semiconductor material connected to the second source of voltage, thereby forming reverse-biased diode capacitance to decouple integrated circuit inherent inductance in series with the first and second sources of voltage; and (d) at least one diode formed in the N-type semiconductor material, having an N+ type semiconductor material terminal connected to the first source of voltage and a P+ type semiconductor material terminal connected to the second source of voltage, thereby forming reverse-biased diode capacitance to decouple integrated circuit inherent inductance in series with the first and second sources of voltage.

10. The CMOS integrated circuit of claim 9 further comprising:

(e) at least one N-channel MOS transistor formed in the P-type semiconductor material having its gate, drain and source connected to the first source of voltage, and the P-type semiconductor material connected to the second source of voltage, thereby forming transistor capacitance to decouple integrated circuit inherent inductance in series with the first and second sources of voltage; and (f) at least one P-channel MOS transistor formed in the N-type semiconductor material having its gate, drain and source connected to the second source of voltage, and the N-type semiconductor material connected to the first source of voltage, thereby forming transistor capacitance to decouple integrated circuit inherent inductance in series with the first and second sources of voltage.

* * * * *